United States Patent [19]

Keramidas et al.

[11] 4,366,186
[45] Dec. 28, 1982

[54] OHMIC CONTACT TO P-TYPE INP

[75] Inventors: Vassilis G. Keramidas, Warren; Robert J. McCoy, Chatham; Henryk Temkin, New Providence, all of N.J.

[73] Assignee: Bell Telephone Laboratories, Incorporated, Murray Hill, N.J.

[21] Appl. No.: 79,451

[22] Filed: Sep. 27, 1979

[51] Int. Cl.³ .................... H01L 21/28; B05D 5/12
[52] U.S. Cl. .................... 427/89; 427/125; 357/67; 357/71; 29/569 L
[58] Field of Search .......... 427/88, 89, 125, 91; 29/569 L; 357/67, 71

[56] References Cited

U.S. PATENT DOCUMENTS

| | | | |
|---|---|---|---|
| 3,215,654 | 10/1965 | Armstrong et al. | 357/71 |
| 3,620,847 | 11/1971 | Wise | 357/65 X |
| 3,850,688 | 11/1974 | Halt | 357/71 X |
| 4,011,583 | 3/1977 | Levinstein et al. | 357/67 |
| 4,022,931 | 5/1977 | Black et al. | 357/65 X |
| 4,218,271 | 8/1980 | Wood | 357/71 X |
| 4,258,375 | 3/1981 | Hsieh et al. | 357/30 X |
| 4,260,429 | 4/1981 | Moyer | 357/67 |

OTHER PUBLICATIONS

Bergh et al., *Light-Emitting Diodes*, Clarendon Press, Oxford, 1976, pp. 441, 456.
Schumaker et al., "Dicing Induced Damage in GaP Electroluminescent Diodes", *Journal of the Electrochemical Society*, vol. 119, No. 9, Sep. 1972, p. 1233.
Schiavone et al., "Ohmic Contacts for Moderately Resistive p-Type InP", *Journal of Applied Physics*, vol. 46, No. 1, Jan. 1975, pp. 452-453.
Ho et al., "Stable Junctions Between GaAs Semiconductors and Metal Contacts Using a Metallic Compounds as a diffusion Barrier", *IBM Tech. Disclosure Bulletin*, vol. 21, No. 4, Sep. 1978, p. 1752.

*Primary Examiner*—John D. Smith
*Assistant Examiner*—Bernard F. Plantz
*Attorney, Agent, or Firm*—Richard D. Laumann

[57] ABSTRACT

An ohmic contact to a semiconductor device comprising p-type InP is formed by sequentially depositing beryllium-gold and gold layers on InP and then heat-treating the device at a temperature less than 440 degrees C. An ohmic contact to p-type InGaAsP can be similarly formed.

15 Claims, 3 Drawing Figures

800 Å : 3 wt % BeAu
2100 Å : Au
ALLOYED AT 420°C

4,366,186

OHMIC CONTACT TO P-TYPE INP

TECHNICAL FIELD

This invention is concerned with a method of making ohmic contacts to p-type InP and InGaAsP and to semiconductor devices having such contacts.

BACKGROUND OF THE INVENTION

Successful semiconductor device fabrication and operation frequently requires contacting the semiconductor device with low resistance ohmic contacts. Problems often arise in attempting to fabricate and use such contacts. For example, the contacting material may form a rectifying, rather than ohmic, contact with the semiconductor material, or it may not reliably bond to the semiconductor material, and physically unreliable electrical contacts result.

Group III–V semiconductor compounds are of much interest today, and much effort has been directed toward developing reliable ohmic contacts with such compounds. Many processes for fabricating low resistance ohmic contacts to such compounds are known. These processes typically involve the deposition of one or more layers and may or may not involve one or more heat treating steps. U.S. Pat. No. 3,214,654 describes ohmic contacts to Group III–V compounds which are formed by a layer of a metal selected from the group consisting of silver, gold, ruthenium, rhodium, palladium, osmium, iridium and platinum and a layer of either nickel or cobalt. Germanium-palladium contacts to n-type Group III–V compounds are described by U.S. Pat. No. 4,011,583.

Particular interest has recently been shown in Group III–V compounds that are useful in optical devices, such as light emitting diodes, lasers and photodetectors, that operate at wavelengths longer than 1.00 micron. It should be understood that the term "light," as used in this specification, includes both the visible and the near infrared portions of the electromagnetic spectrum. Interest in devices that operate in this region has arisen primarily because the silica-based optical fiber compositions presently contemplated for optical communication systems have smaller material dispersion, as well as low loss, above 1.00 micron than they do below 1.00 micron.

One class of light emitting devices presently contemplated for such systems uses the quaternary alloy, InGaAsP, which is grown on InP. Such devices are useful between 0.95 $\mu$m and 1.68 $\mu$m. These light emitting devices operate at high forward current and require high quality ohmic contacts to reduce series resistance. For this class of device, as well as others, ohmic contacts to InP are necessary.

While low resistance ohmic contacts to n-type InP can now be easily fabricated, the formation of ohmic contacts to p-type InP still presents difficulties. P-type contacts to InP have been made using Zn as the acceptor. While these contacts are quite acceptable for many purposes, they have a number of drawbacks. For example, *Journal of Applied Physics*, 46, pp. 452–453 (1975) reports a rather high resistance, namely, $10^{-3}$ ohm.cm$^2$, for an electroplated Au/Zn/Au metallization. Furthermore, additional problems arise when Zn is used as the acceptor because the relative volatility of Zn makes it difficult to fabricate the contact with vacuum deposition techniques. Moreover, rapid diffusion of the Zn through the InP, together with the high doping concentrations required, may cause either junction motion or long-term device reliability problems or both.

Ohmic contacts to some Group III–V compounds using Be-Au metallizations, i.e., Be is used as the acceptor, are known. For example, such metallizations have been made to p-type GaP. However, formation of these ohmic contacts has required heating the GaP devices to the relatively high temperature of 600 degrees C. for approximately 5 minutes to form the ohmic contact. Alloying temperatures of 600 degrees C. cannot be used to form ohmic contacts to either InP or InP containing devices because InP begins to decompose through P outdiffusion at approximately 400 degrees.

SUMMARY OF THE INVENTION

We have found that ohmic contacts having low resistance can be made to p-type InP material in a semiconductor device by using beryllium as the acceptor. The contact is formed by sequentially depositing, on the InP, a 1 to 3 percent, by weight, beryllium in gold (Be-Au) composition and a gold overlay. The deposition is followed by heat treating the deposited material at a temperature less than 440 degrees C. for a time of at least 1 minute. Deposition of a palladium layer on the InP layer prior to the deposition of the Be-Au layer permits use of a heat treating temperature less than 420 degrees C. but generally results in a contact with a slightly higher resistance. This method may also be used to produce a low resistance ohmic contact to p-type InGaAsP.

DETAILED DESCRIPTION

Figure 1:
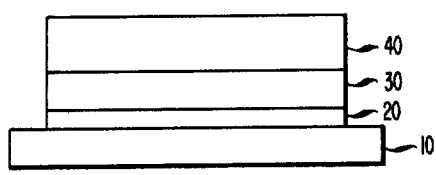
FIG. 1 is a cross-sectional view of a device processed according to this invention.

FIG. 1 shows a semiconductor device 1 having a layer 10. Layer 10 may be a substrate, but is more typically an epitaxial layer grown on a substrate. Device 1 may be a light emitting diode, laser, etc. Layers 20, 30 and 40 are sequentially deposited above layer 10 and form the ohmic contact after heat treating. The semiconductor device further comprises additional semiconductor materials (not shown) deposited on layer 10 opposite layer 20. Layer 10 consists of InP. Layer 20 consists of palladium, layer 30 consists of a beryllium-gold composition, and layer 40 consists of gold. For reasons that will be explained, the presence of layer 20 is optional. If layer 20 is omitted, layer 30 is deposited directly on the substrate. The InP layer may be covered with an InGaAsP layer prior to deposition of layer 20, in which case the ohmic contact is made to the InGaAsP layer. Conventional techniques, such as electron gun evaporation, may be used to deposit the layers. Beryllium has a vapor pressure very similar to that of gold and can, therefore, be evaporated very reproducibly from beryllium-gold sources. Pressures are desirably held below $6 \times 10^{-6}$ torr.

Conventional p-type dopants may be used in the InP substrate. For example, Zn, with a concentration of $8 \times 10^{18}$ cm$^{-3}$ may be used in a liquid-encapsulated Czochralski (LEC) grown substrate. The particular p-type dopant used is not critical to formation of an ohmic contact with this invention. The dopant concentration should, however, be at least $10^{17}$ cm$^{-3}$ to form an ohmic contact. The dopant concentration should be as high as is practical because resistance decreases as the dopant concentration increases. The method of substrate growth and the substrate orientation are both noncritical.

Layer 20 is optional and when present, is approximately 100 Å thick. A layer of 100 Å is sufficiently thick to trap outdiffusing P through formation of intermetallic P-Pd compounds without impeding Be migration into the InP substrate. Thicker layers may result in the formation of undesired Pd compounds. This layer permits, as subsequently described, lowering of the heat treating or alloying temperature and, therefore, reduction of the InP tendency for thermal dissociation. There may, however, be a slight increase in contact resistance when the Pd layer is present.

Layer 30 consists of a gold beryllium composition having between 1 and 3 percent, by weight, beryllium. The described weight percent range of Be is desirable because Be and Au form well-defined structures within this range. Layer 30 is typically 800 Å thick, although thicknesses as small as 600 Å and as large as 1000 Å may be used. Below 600 Å, there may not be sufficient Be for the reaction, and above 1000 Å, too much Be may be present. The presence of too much Be makes contact formation difficult as the reaction is driven by Au. A Be content of 3 percent is preferred over 1 percent because at the lower weight percent, contact uniformly is not as good.

Gold layer 40 is at least 2100 Å thick and may be thicker if so desired. However, if layer 40 is thinner, the contact may not be uniform and smooth after heat treating. The minimum thickness is conveniently used.

After deposition of the layers, the structure is heat-treated at a temperature less than 440 degrees C. for a residence time of at least 1 minute. If the palladium layer is not present, the preferred range for heat treating is between 400 degrees C. and 440 degrees C., and the residence time is between 5 and 10 minutes. If palladium layer 20 is present, the alloying temperature is preferably less than 420 degrees C., and the residence time is at least 1 minute. The preferred heat treating temperature is approximately 400 degrees C. Temperatures outside the above range have higher contact resistances, and are, therefore, less prefered.

Heat treating conveniently takes place in any of the conventionally used atmospheres such as forming gas (a hydrogen-nitrogen mixture), argon or nitrogen.

Figure 2:
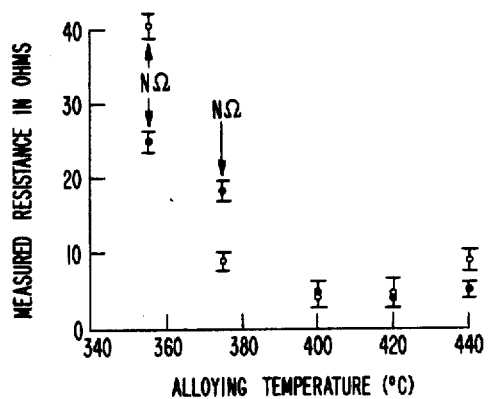
FIG. 2 plots alloying temperature, horizontally, versus resistance in ohms, vertically, for a contact of this invention.
Figure 3:
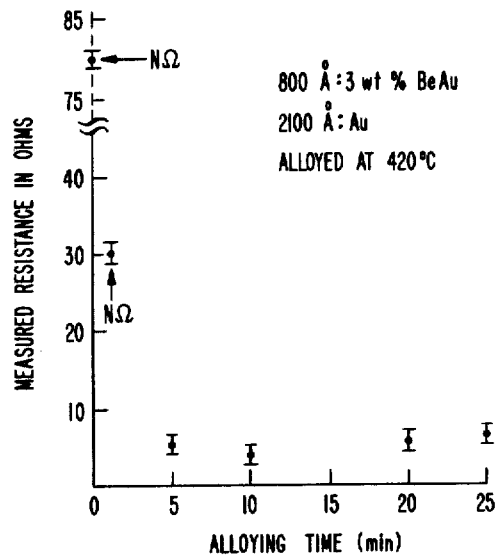
FIG. 3 plots alloying time, horizontally, versus resistance in ohms, vertically, for a contact of this invention.

Alloying or heat treating times and temperatures may be determined with more specificity by reference to FIGS. 2 and 3 which show the measured resistance as functions of treating temperatures and times, respectively.

FIG. 2 plots alloying temperature in degrees centigrade, horizontally, versus resistance in ohms, vertically, for contacts having an 800 Å thick 3 weight percent Be in Au layer, and a 2100 Å thick Au layer. The open circles represent contacts with a 100 Å thick Pd layer, and the solid circles represent contacts in which a Pd layer was not present. The contacts were alloyed for 10 minutes. The contact resistances are a minimum between 400 and 440 degrees C. without the Pd layer. With the Pd layer present, temperatures equal to or above 375 degrees C. may be used.

It is hypothesized that lower heat treating temperatures can be used with the palladium layer because the palladium layer traps outdiffusing phosphorous and forms intermetallic palladium-phosphorous compounds. The resistance obtained by this scheme is generally slightly greater than that obtained without the palladium layer. However, the ohmic contact can be formed adequately, i.e., with an acceptably small resistance, at a temperature as low as 375 degrees C. compared to the approximately 400 degrees C. needed if the palladium layer is not present. At 375 and 400 degrees C., the resistances are approximately 10 and 5 ohms, respectively.

FIG. 3 plots alloying time in minutes, horizontally, versus resistance in ohms, vertically, for contacts having an 800 Å 3 weight percent Be in Au layer and a 2100 Å Au layer. The contacts were alloyed at 420 degrees C. The contact resistances are a minimum for alloying times between 5 and 10 minutes. Heat treating times outside this range lead to higher resistances, especially for shorter times. Longer times are not preferred because of the increased possibility that undesired intermetallic compounds may be formed in addition to the possibility of InP decomposition.

Example: A double heterostructure InP/InGaAsP/InP light emitting diode was grown by liquid phase epitaxy on a [100] oriented n-type InP substrate and consisted of a buffer layer approximately 2 microns thick Sn doped, (n = $10^{18}$cm$^{-3}$), a 1-micron thick active InGaAsP layer (n = $2 \times 10^{16}$cm$^{-3}$), and a Zn-doped (n = $10^{18}$cm$^{-3}$) p-type InP layer having thickness of 1.5 microns. An ohmic contact was made to the p-type layer as described above. The contact was a 50 micron dot. The contact to the n-type layer was a horseshoe-shaped sandwich of Au-Sn-Au about 5000 Å thick. At a current of 60 mA and a forward voltage of approximately 1.5 eV, and power emitted into the air was approximately 3 mW. This corresponds to a power conversion efficiency of approximately 3 percent. The upper limit of specific contact resistance was $7.8 \times 10^{-5}$ ohm.cm. This value is approximately two orders of magnitude lower than specific resistances previously reported for Au-Zn contacts to InP.

We claim:

1. A method for making an ohmic contact to a semiconductor device comprising a p-type semiconductor material selected from the group consisting of InP and InGaAsP comprising the steps of:
   depositing beryllium-gold on said semiconductor material;
   depositing gold on said beryllium-gold; and
   heat treating said device at a temperature less than 440 degrees C. for a residence time of at least 1 minute.

2. A method as recited in claim 1 in which said heat treating is in an inert or reducing atmosphere.

3. A method as recited in claim 1 or 2 in which said semiconductor is InP.

4. A method as recited in claim 3 in which said beryllium-gold layer has a beryllium content, by weight, between 1 percent and 3 percent.

5. A method as recited in claim 4 in which said beryllium-gold layer is greater than 600 Å and less than 1000 Å.

6. A method as recited in claim 5 in which said beryllium-gold layer is approximately 800 Å thick.

7. A method as recited in claim 1 in which said gold layer is at least 2100 Å thick.

8. A method as recited in claim 5 in which said heat treating temperature is between 400 and 440 degrees C.

9. A method as recited in claim 8 in which said heat treating is for approximately 10 minutes.

10. A method as recited in claim 1 further comprising the step of depositing a palladium layer approximately 100 Å thick above said InP layer, said palladium layer being deposited prior to said beryllium-gold layer.

11. A method as recited in claim 10 in which said heat treating is at a temperature less than 420 degrees C.

12. A method as recited in claim 11 in which said temperature is approximately 400 degrees C.

13. A method as recited in claim 12 in which said heat treating is for approximately 10 minutes.

14. A method as recited in claim 12 or 13 in which said device is a light emitting diode.

15. A method as recited in claim 5 in which said gold layer is at least 2100 Angstrom thick.

* * * * *